United States Patent [19]

Ogura et al.

[11] Patent Number: 5,545,906

[45] Date of Patent: Aug. 13, 1996

[54] NON-VOLATILE SEMICONDUCTOR MEMORY DEVICE WITH CONTAMINATION PROTECTION LAYERS

[75] Inventors: Hidemitsu Ogura; Koichi Kanzaki, both of Kawasaki, Japan

[73] Assignee: Kabushiki Kaisha Toshiba, Kawasaki, Japan

[21] Appl. No.: 357,766

[22] Filed: Dec. 16, 1994

Related U.S. Application Data

[63] Continuation of Ser. No. 979,216, Nov. 20, 1992, abandoned.

[30] Foreign Application Priority Data

Nov. 21, 1991 [JP] Japan ................... 3-305186

[51] Int. Cl.⁶ .............................. H01L 29/788
[52] U.S. Cl. .............. 257/315; 257/323; 257/435; 257/294
[58] Field of Search ..................... 257/315, 294, 257/323, 435

[56] References Cited

U.S. PATENT DOCUMENTS 4,601,097  7/1986  Shimbo .......................... 257/435
4,609,930  9/1986  Yamazaki ....................... 257/435
4,942,450  7/1990  Iwashita ......................... 257/323
5,172,200  12/1992  Muragishi ....................... 257/315

FOREIGN PATENT DOCUMENTS 2-65277  3/1990  Japan ............................ 257/294

*Primary Examiner*—Jerome Jackson
*Attorney, Agent, or Firm*—Banner & Allegretti, Ltd.

[57] ABSTRACT

A non-volatile semiconductor device comprises a memory cell having a P-type silicon substrate, an N-type diffusion region formed in the substrate and serving as a word line, N-type diffusion region one serving as a source and the other as a drain of the cell transistor, a floating gate extending from a region above the diffusion region over a region above between diffusion regions, and a bit line connected to the diffusion regions. Such a memory cell is characterized in that a passivation film is formed on an interlayer insulation film insulating the floating gate and the bit lines from each other, and that a contaminant shut-off layer is provided between the passivation film and the floating gate. With this structure, the route carrying contaminants into the cell can be shut off even during manufacture thereof, achieving a high reliability of the product.

22 Claims, 12 Drawing Sheets

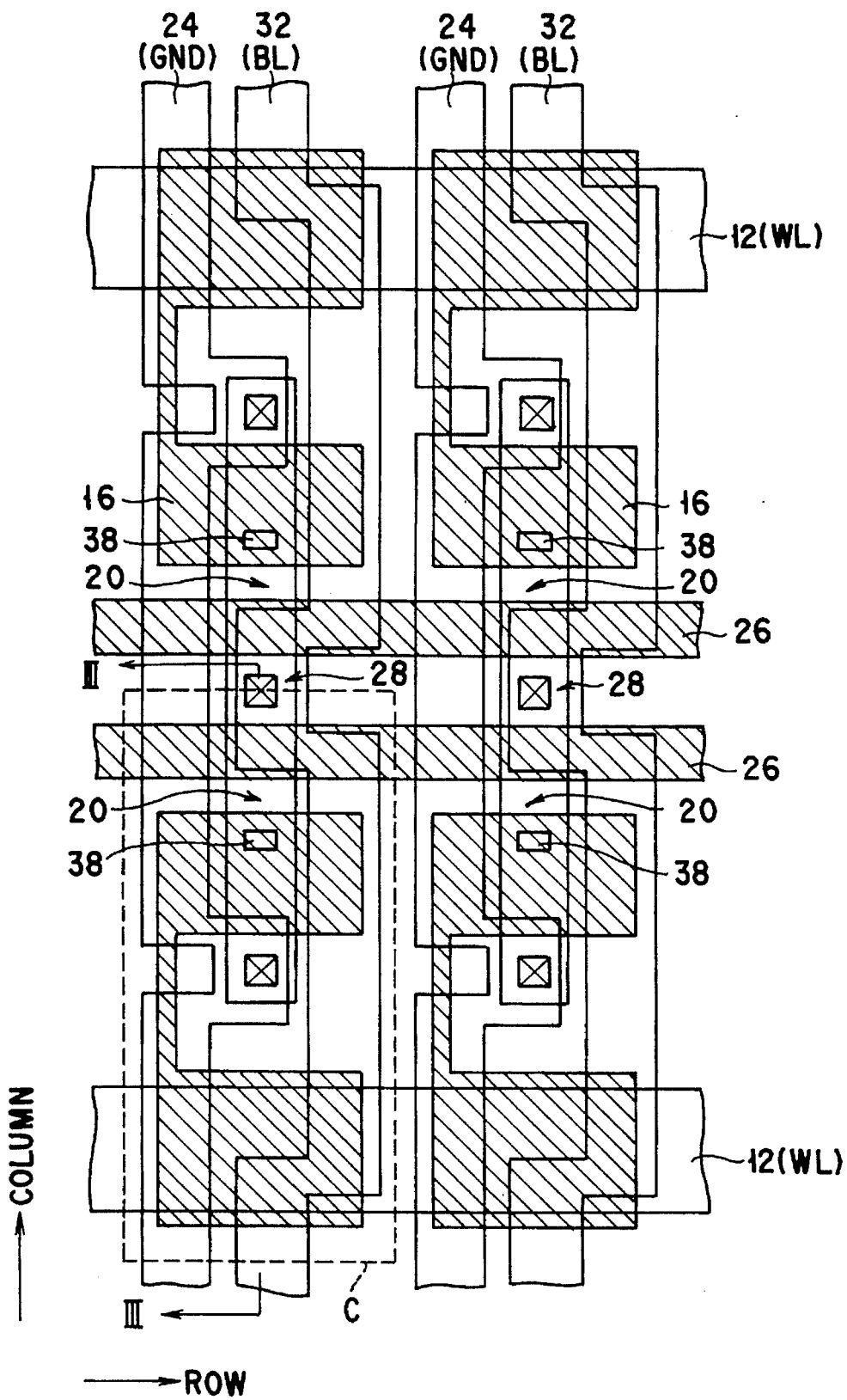
F I G. 5

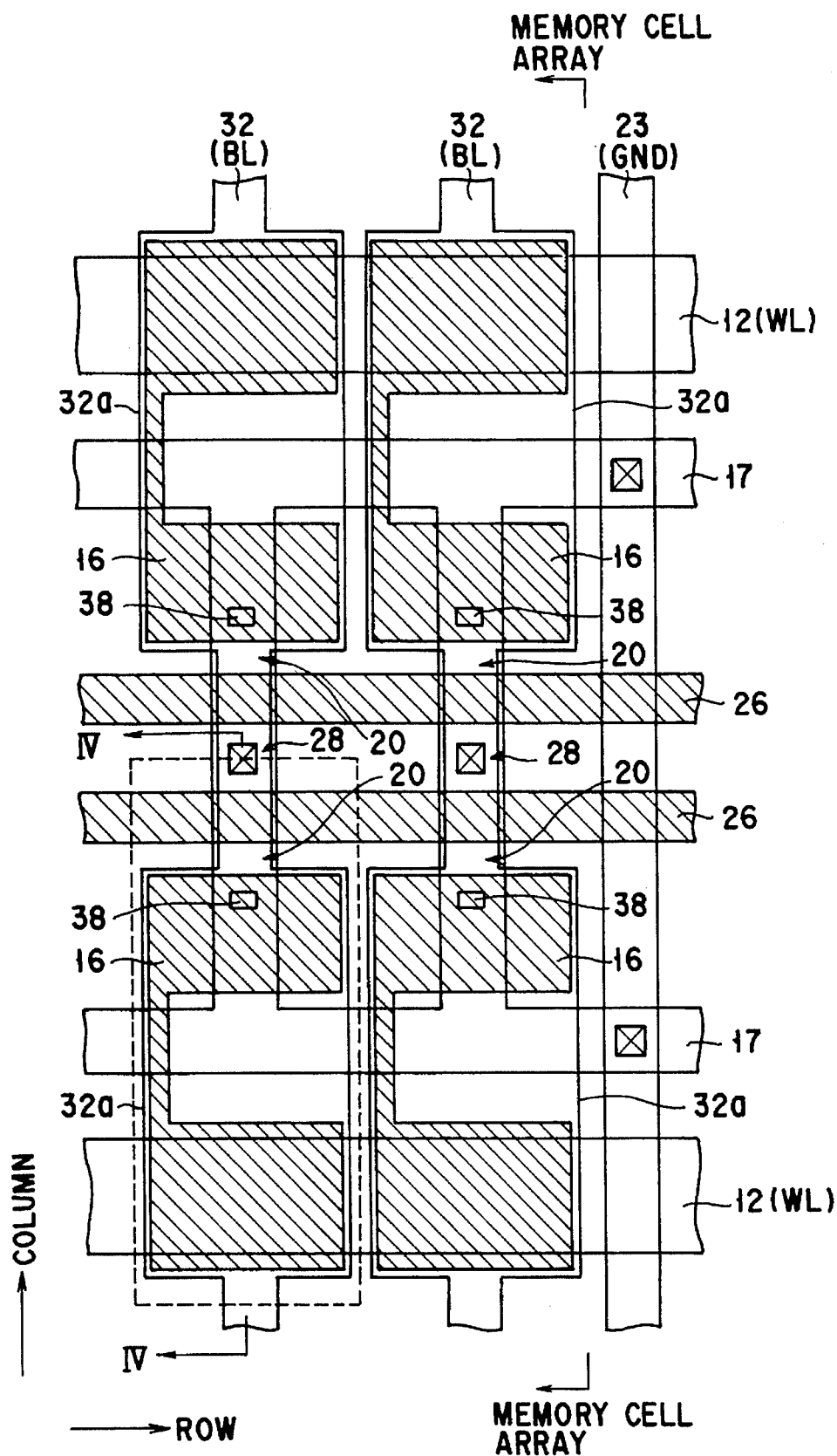
F I G. 8

NON-VOLATILE SEMICONDUCTOR MEMORY DEVICE WITH CONTAMINATION PROTECTION LAYERS

This application is a continuation of application Ser. No. 07/979,216, filed Nov. 20, 1992, now abandoned.

BACKGROUND OF THE INVENTION

1. Field of the Invention

The present invention relates to a non-volatile semiconductor memory device and, more specifically, to an electrically erasable programmable read only memory including cells each having a so-called "single polysilicon layer structure" in which a diffusion layer serving as a word line is formed in a substrate.

2. Description of the Related Art

FIG. 1 is a plan view of a pattern of an electrically erasable programmable read only memory (to be called EEPROM hereinafter) including cells each having a conventional "single polysilicon layer structure". FIG. 2 is a cross section of the EEPROM along the line I—I in FIG. 1. As can be seen in FIGS. 1 and 2, an N-type diffusion region 12 serving as a word line WL is formed in a P-type silicon substrate 10. A gate oxidation film 14 is formed on the diffusion region 12, and a polysilicon floating gate 16 is formed on the gate oxidation film 14. The floating gate 16 extends from a region above the diffusion region 12, over a region above a channel region 22. The channel region 22 is interposed between an N-type diffusion region 18 serving as a source of the cell transistor, and an N-type diffusion region 20 serving as a drain thereof. The diffusion region 18 is electrically connected to an aluminum alloy grounding wire 24 which is grounded (GND). Data is stored in accordance with a charge status of the floating gate. Specifically, data is determined depending on whether or not an inversion layer is formed in the channel region 22. For example, in the case where an inversion layer is formed in the channel region 22, the diffusion regions 18 and 20 are electrically connected to each other, and the potential of the diffusion layer 20 will be at the ground level. Then, when a selection gate (SG) 26 is set at the "H" level, an inversion layer is formed in the channel 30 located between the diffusion region 20 and an N-type diffusion region 28. The diffusion region 28 is also set at the ground level. Since the diffusion region 28 is electrically connected to an aluminum alloy bit line (BL) 32, the potential of the bit line 32 is also set at the ground level. In the case where no inversion layer is formed in the channel 22, the potential of the bit line 32 never varies. A field oxidation film 34 separates the diffusion region 12 serving as a word line and a cell transistor region from each other. An interlayer insulation film 36 insulates the polysilicon layer including the floating gate 16 and the selection gate 26, and the aluminum alloy layer including the grounding line 24 and the bit line 32 from each other. A tunnel oxidation film 38 injects electrons from the diffusion region 20 to the floating gate 16. A PSG film 40 and a silicon nitride film 42 are formed as the last passivation film consecutively on the grounding line 24 and the bit line 32. In the case of an EEPROM having the above-described single polysilicon layer structure, the silicon nitride film 42, once formed, can shut off the route which may carry contaminants including movable ions, moisture, etc., into the cell from outside.

However, before the formation of the nitride film 42, the route which may introduce these contaminants into the cell is not completely shut off, and therefore 10 the cell may be contaminated by these substances during the manufacturing procedure, degrading the reliability of the cell.

SUMMARY OF THE INVENTION

The present invention has been proposed in consideration of the above problem, and an object of the present invention is to provide a highly reliable non-volatile semiconductor memory device having a structure by which the route for carrying contaminants into the cell is shut off even during manufacture of the device.

According to an aspect of the present invention, there is provided a non-volatile semiconductor device comprising: a semiconductor substrate; a floating gate formed on the semiconductor substrate via an insulation film, for controlling conduction of a channel region formed in a surface of the semiconductor substrate in accordance with a potential of a word line; and a contaminant shut-off layer formed such as to cover a region above at least the floating gate, for avoiding contaminants entering the floating gate.

According to another aspect of the present invention, there is provided a non-volatile semiconductor device comprising: a semiconductor substrate of a first conductivity type; a first semiconductor layer of a second conductivity type formed in the semiconductor substrate, and serving as a word line commonly provided for memory cells adjacent to each other in a row direction; a second semiconductor layer of a second conductivity type formed in the semiconductor substrate, and serving as a source region commonly provided for memory cells adjacent to each other in a row direction; a third semiconductor layer of a second conductivity type serving as a drain region formed in the semiconductor substrate; a floating gate formed on the semiconductor substrate via an insulation film, for controlling conduction of a channel region formed between the source region and the drain region in accordance with a potential of the first semiconductor layer; and a bit line formed straight in a column direction of a conductive film electrically connected to the drain region, and having a widened portion at a region above the floating gate for covering the entire region above the floating gate so as to avoid contaminants entering into the floating gate.

In the above-described non-volatile semiconductor memory device, a contaminant shut-off layer is provided between the passivation film and the floating film. With this structure, the route which carries contaminants into the floating gate in which data is stored can be shut off not only by the passivation film, but also by this contaminants shut-off layer even before formation of the passivation film. Thus, contamination of the cell can be avoided even during manufacture thereof, thereby increasing the reliability of the cell. The cell is protected by the double structure including the passivation film and the contaminants shut-off layer. As a result, the quality of the device is maintained high after completion of the device, guaranteeing a high reliability for a long period of time.

A contaminants shut-off layer can be obtained by, for example, forming a nitride film above a floating gate, forming a high-resistance polysilicon film above an interlayer insulation film, or widening the width of a bit line of aluminum alloy film above a floating gate to cover it. In any of the mentioned examples, the contaminant route to the cell, or the floating gate in particular, can be shut off.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 5 is a plan view of a pattern of a non-volatile semiconductor memory device according to the second embodiment of the present invention;

FIG. 8 is a plan view of a pattern of a non-volatile semiconductor memory device according to the fourth embodiment of the present invention;

DETAILED DESCRIPTION OF THE PREFERRED EMBODIMENTS

Figure 1:
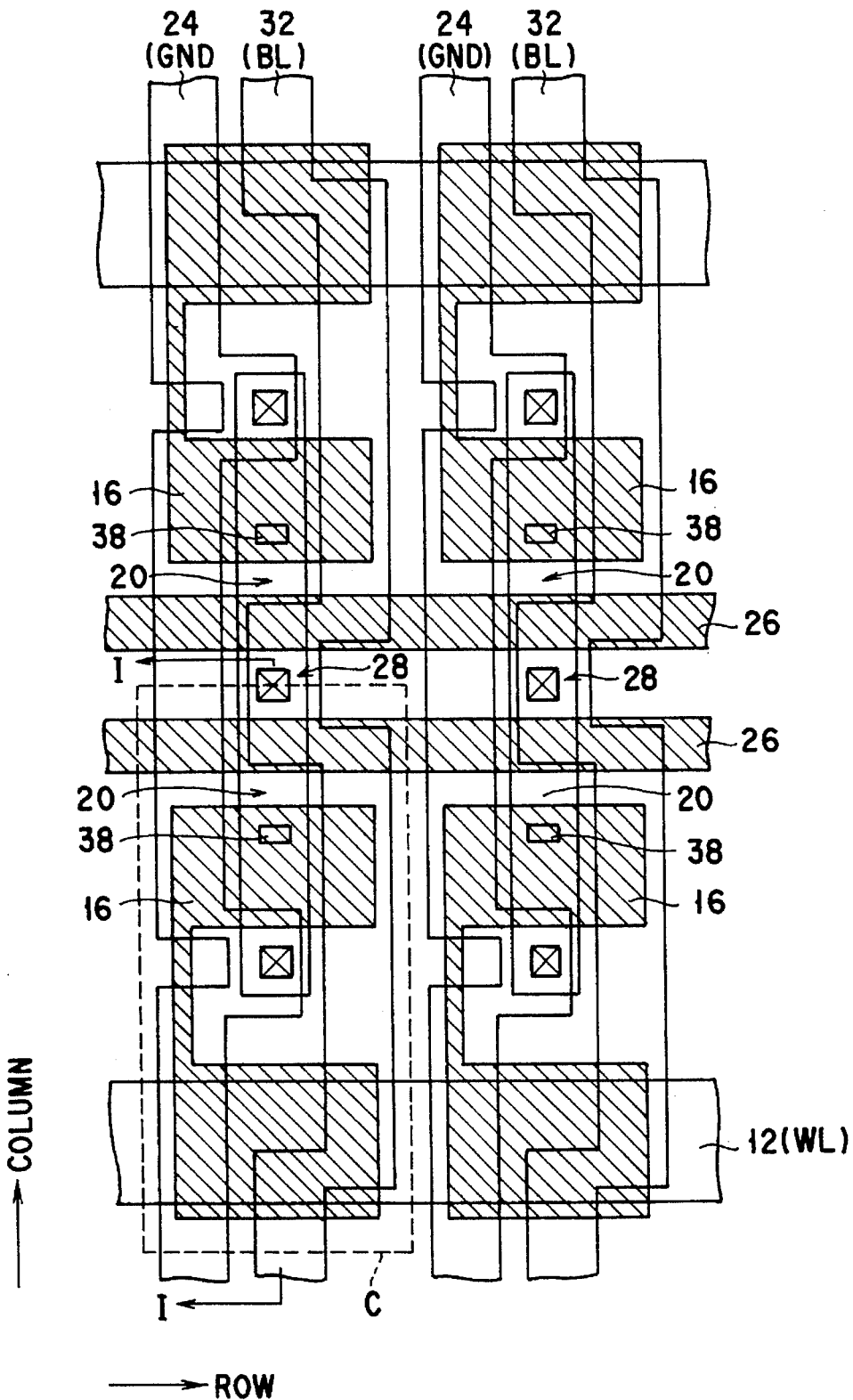
FIG. 1 is a plan view of a pattern of a conventional non-volatile semiconductor memory device.
Figure 2:
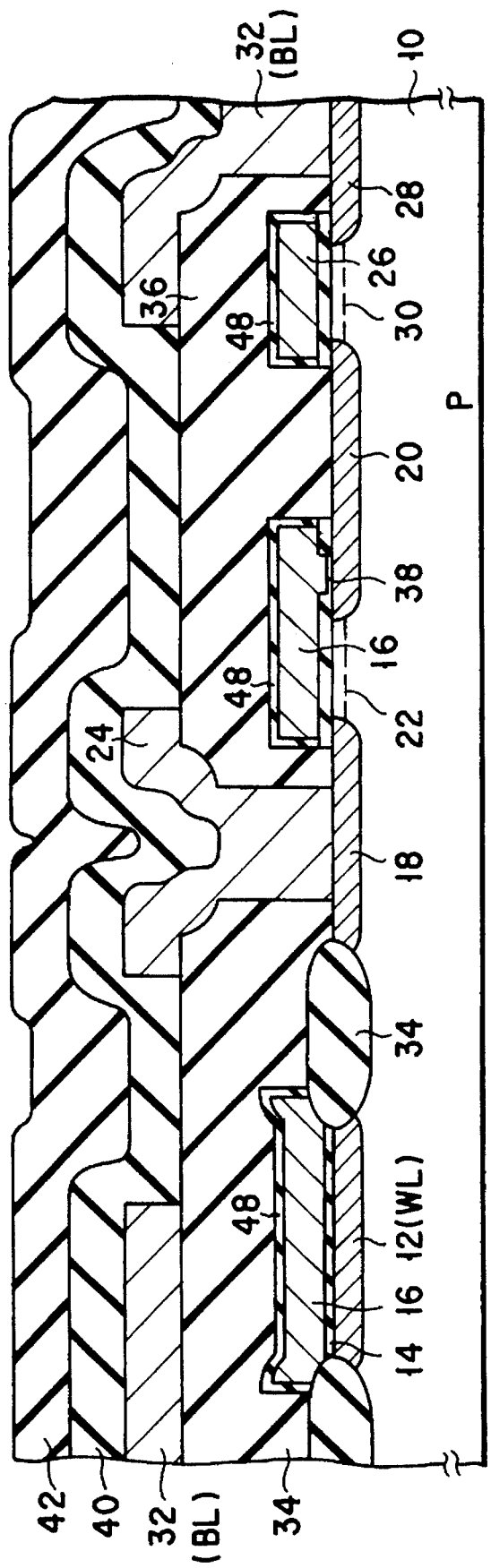
FIG. 2 is a diagram showing cross section of the memory device shown in FIG. 1 along the line I—I.

Embodiments of the present invention will now be described with reference to accompanying drawings. In the description of the embodiments, the same items are designated by the same reference numerals throughout the figures.

Figure 3:
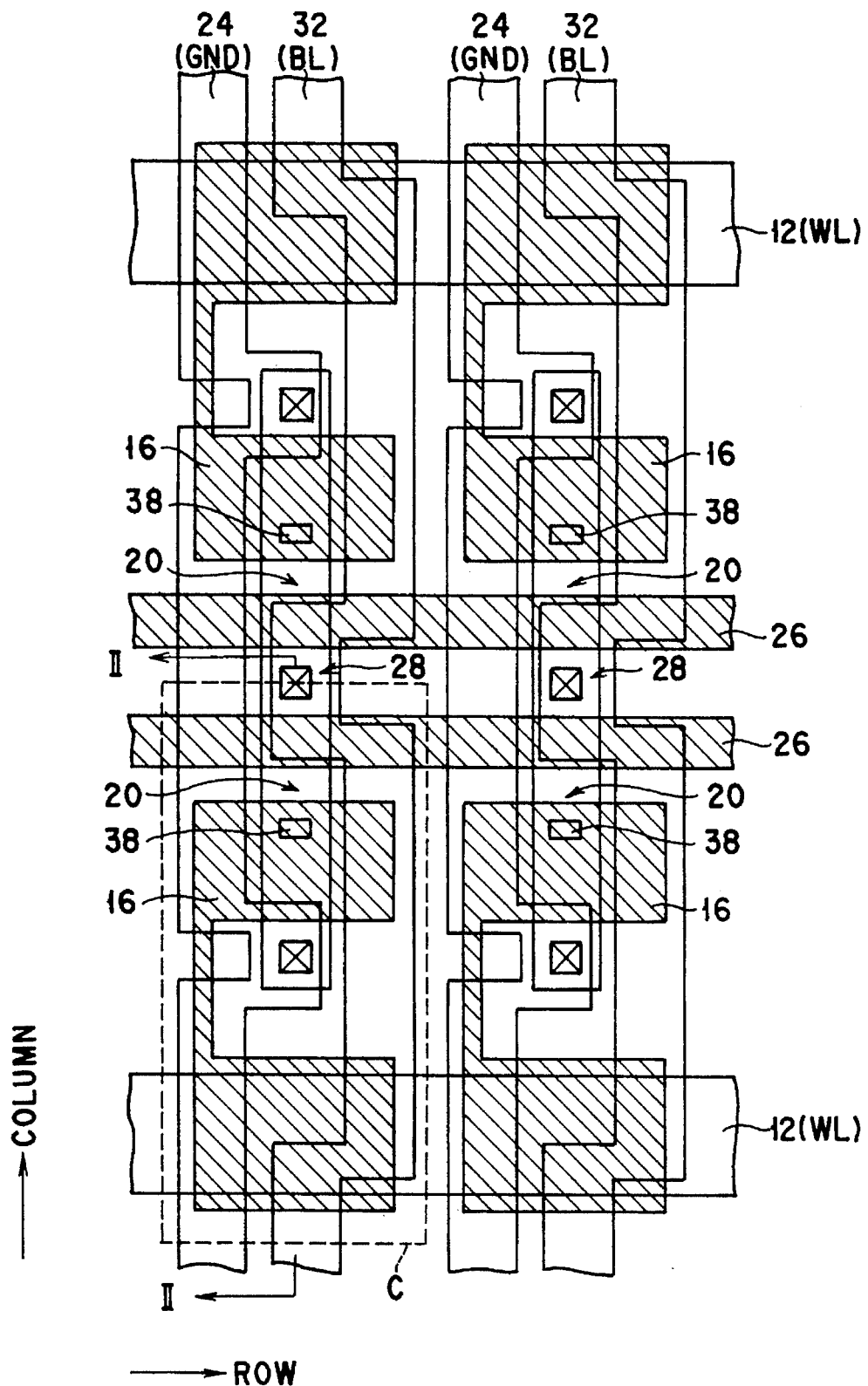
FIG. 3 is a plan view of a pattern of a non-volatile semiconductor memory device according to the first embodiment of the present invention.
Figure 4:
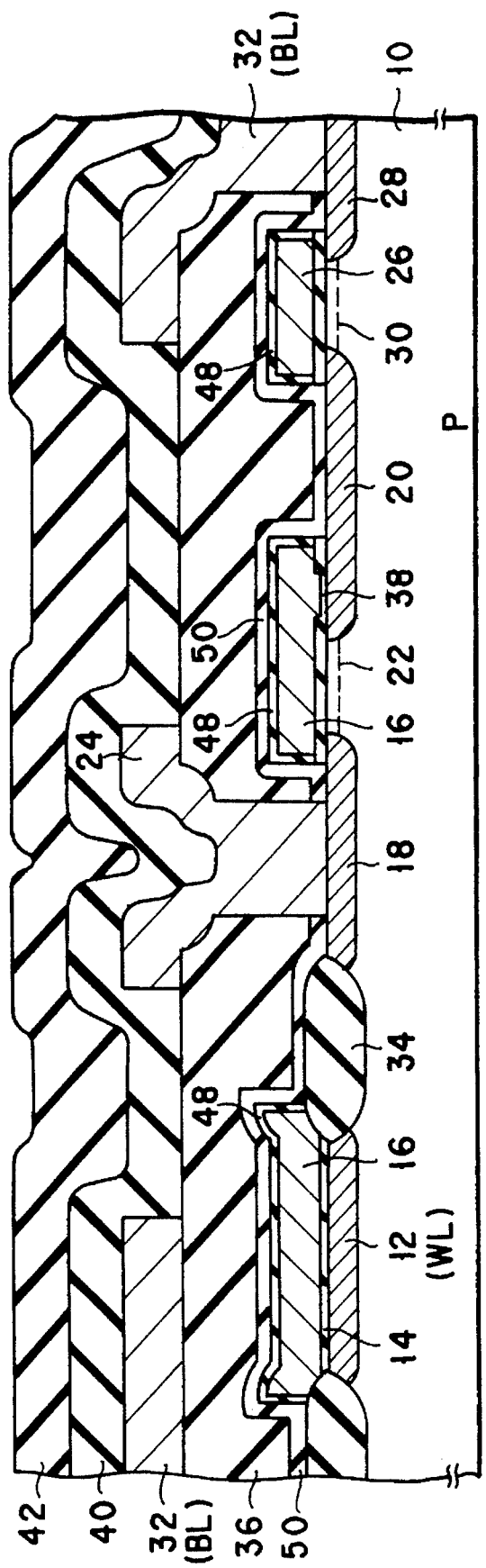
FIG. 4 is a diagram showing a cross section of the memory device shown in FIG. 3 along the line II—II.

FIG. 3 is a pattern plan view of an EEPROM including a cell having a "single polysilicon layer structure" according to the first embodiment of the present invention. FIG. 4 is a cross section of the EEPROM shown in FIG. 3 taken along the line II—II. As can be seen in FIGS. 3 and 4, an N-type diffusion region 12 serving as a word line WL is formed in a P-type silicon substrate 10. A gate oxidation film 14 is formed on the diffusion region 12. A floating gate 16 is formed on the gate oxidation film 14. The floating gate 16 extends from a region above the diffusion region 12 over a region above a channel region 22. The channel region 22 is interposed between an N-type diffusion region 18 serving as a source of the cell transistor and an N-type diffusion region 20 serving as a drain thereof. The diffusion region 18 is electrically connected to an aluminum alloy grounding wire 24 which is grounded (GND). Data is stored in accordance with a charge status of the floating gate 16. Specifically, data is determined depending on whether an inversion layer is formed in the channel region 22. For example, in the case where an inversion layer is formed in the channel region 22, the diffusion regions 18 and 20 are electrically connected to each other, and the potential of the diffusion region 20 will be at the ground level. Then, when a selection gate (SG) 26 is set at the "H" level, an inversion layer is formed in the channel region 30 located between the diffusion region 20 and an N-type diffusion region 28. Thus, the diffusion region 28 is also set at the ground level. Since the diffusion region 28 is electrically connected to an aluminum alloy bit line (BL) 32, the potential of the bit line 32 is also set at the ground level. In the case where no inversion layer is formed in the channel region 22, the potential of the bit line 32 never varies. A field oxidation film 34 separates the diffusion region 12 serving as a word line and a cell transistor (element) region from each other. An interlayer insulation film 36 insulates the polysilicon layer including the floating gate 16 and the selection gate 26, and the aluminum alloy layer including the grounding line 24 and the bit line 32 from each other. Further, a tunnel oxidation film 38 injects electrons from the diffusion region 20 to the floating gate 16. A PSG film 40 and a silicon nitride film 42 are formed as the last passivation film consecutively on the grounding line 24 and the bit line 32. Further, an oxidation film 48 is formed on each of the floating gate 16 and the selection gate 26. Each oxidation film 48 is formed during a later oxidation step carried out after formation of the floating gate 16 and the selection gate 26 obtained by patterning the first polysilicon film. On the oxidation film 48, formed is a silicon nitride film 50 such as to cover at least a region above the floating gate.

As described above, the EEPROM in FIG. 3 has the structure in which the nitride film 50 is formed such as to cover at least the floating gate 16. Therefore, the cell can be protected from contaminants including movable ions and moisture by this nitrogen film 50. The protection effect is significant particularly in the production steps before formation of the last laminated passivation film, i.e. the PSG film 40 and the nitride film 42. Also after completion of the device, the nitride film 50 serves to protect the cell from contaminants along with the nitride film 42 serving as a passivation film. Thus, as compared to the device having only an nitride film 42 as a passivation film, the device of the present invention entails the advantage of protecting the cell from contaminants, and therefore the reliability of the device can be maintained for a long period of time.

Figure 6:
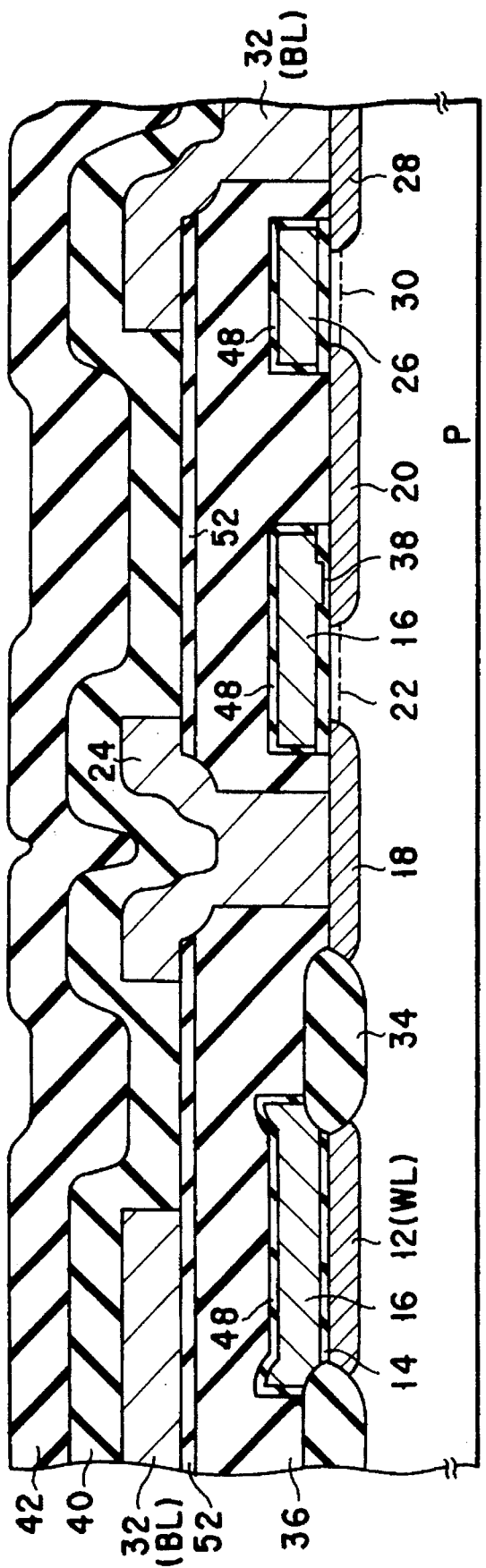
FIG. 6 is a diagram showing a cross section of the memory device shown in FIG. 5 along the line III—III.

FIG. 5 is a pattern plan view of an EEPROM including a cell having a "single polysilicon layer structure" according to the second embodiment of the present invention. FIG. 6 is a cross section of the EEPROM shown in FIG. 5 taken along with the line III—III. As shown particularly in FIG. 6, a polysilicon film 52 having a resistance value substantially as high as that of the insulator may be formed on an interlayer insulation film 36 so as to cover at least a region above the floating gate 16. The interlayer insulation film 36 comprises PSG film, BPSG film, or laminated film of PSG and BPSG. The polysilicon film 52 can be obtained from, for example, the polysilicon film remaining undoped. The polysilicon film 52 may also be formed from an undoped polysilicon layer used for increasing bonding strength between the barrier metal layer and the interlayer insulating film 36. In this case, the polysilicon film 52 is formed on the interlayer insulating film 36 such as to cover at least the floating gate 16 while patterning the polysilicon film. In an EEPROM having the above-described structure, the polysilicon film 52 which is formed on the interlayer insulation film 36 so as to cover at least the region above the floating gate 16, serves to shut off the route carrying contaminants into the cell. As a result, an advantage similar to that of the EEPROM described in the first embodiment can be achieved also here.

Figure 7:
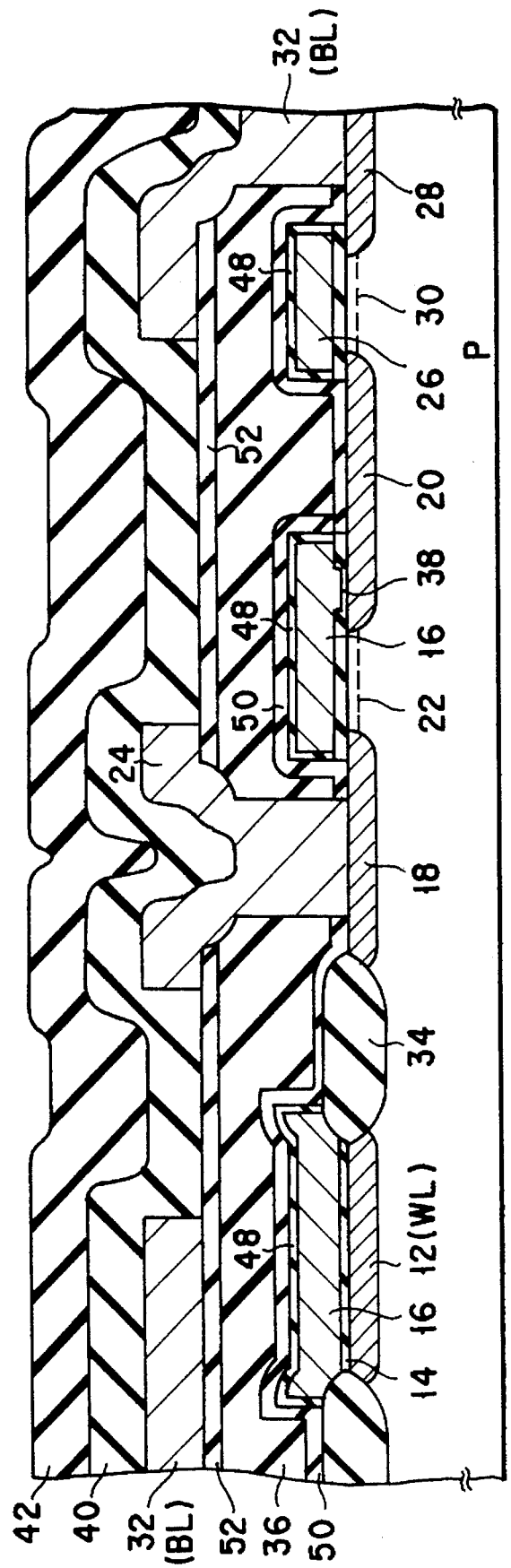
FIG. 7 is a diagram showing a cross section of a pattern of a non-volatile semiconductor memory device according to the third embodiment of the present invention.

FIG. 7 is a cross section of a cell having a "single polysilicon layer structure" according to the third embodiment of the present invention. As shown in FIG. 7, this cell has the structure of combination of the type shown in FIG. 4 and that shown in FIG. 6. Similarly, a region above at least the floating gate 16 may be covered by a nitride film 50. A polysilicon film 52 having a low resistance value substantially the same as that of the insulator may be formed on the interlayer insulation film 36. With the EEPROM having the described structure, an advantage similar to those of the first and second embodiments can be obtained.

Figure 9:
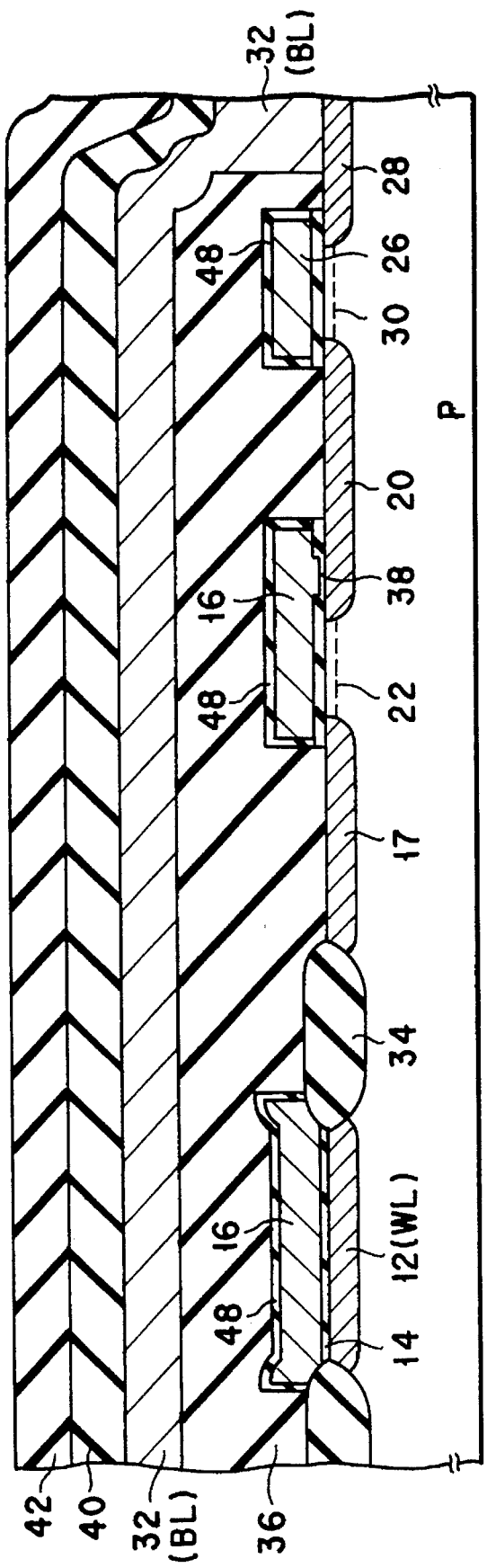
FIG. 9 is a diagram showing a cross section of the memory device shown in FIG. 8 along the line IV—IV.

FIG. 8 is a pattern plan view of an EEPROM including a cell having a "single polysilicon layer structure" according to the fourth embodiment of the present invention. FIG. 9 is a cross section of the cell shown in FIG. 8 taken along the line IV—IV. An N-type diffusion region 12 serving as a word line is formed on a P-type silicon substrate 10. A gate oxidation film 14 is formed on the diffusion region 12. A polysilicon floating gate 16 is formed on the gate oxidation film 14. The gate oxidation film 14 extends from above the diffusion region 12 over a region above a channel region. The channel region is interposed between an N-type diffusion region 17 serving as a source of the cell transistor and an N-type diffusion region 20 serving as a drain thereof. As shown in FIG. 8, in the memory cell array, cells C adjacent to each other in the row direction are commonly connected to the diffusion region 17. The diffusion region 17 is electrically brought into contact with the aluminum alloy grounding line 23 outside the memory cell array, via a contact hole 25, for example, in order for grounding (GND). In other words, the source regions of all the transistors are commonly connected with each other by the diffusion region 17 which is connected to the grounding line 23, i.e., a source wire. Data is stored in accordance with a charge status of the floating gate. Specifically, data is determined depending on whether an inversion layer is formed in the channel region 22. For example, in the case where an inversion layer is formed in the channel region 22, the diffusion regions 17 and 20 are electrically connected to each other, and the potential of the diffusion region 20 will be at the ground level. Then, when a selection gate (SG) 26 is set at the "H" level, an inversion layer is formed in the channel region 30 located between the diffusion region 20 and an N-type diffusion region 28. The diffusion region 28 is also set at the ground level. Since the diffusion region 28 is electrically connected to an aluminum alloy bit line (BL) 32, the potential of the bit line 32 is also set at the ground level. In the case where no inversion layer is formed in the channel region 22, the potential of the bit line 32 never varies. An PSG film 40 and a silicon nitride film 42 are formed in the mentioned order on the grounding line 23 and the bit line 32 as a passivation film.

As shown in FIGS. 8 and 9, the diffusion region 17 serving as the sources of the cell transistors is commonly connected to cells adjacent to each other in the row direction. Each memory cell C therefore requires only one bit line 32 thereon in the column direction. As compared to a conventional cell on which two wirings, a bit line and a grounding line must be provided, cells of the present invention require only one bit line. Consequently, the area of each cell can be reduced. Specifically, in the EEPROM shown in FIGS. 8 and 9, the number of wirings extending in the column direction is less than a conventional one, and therefore the width of each cell in the row direction is less. Thus, the degree of integration of cells can be increased especially in the row direction, according to the present invention. Further, those contact holes 25 which gives a predetermined potential to the diffusion region 17 are arranged outside the cell array. As a result, the number of the contact holes in the cell array is reduced, thereby reducing the size of cell. Moreover, since the grounding line 23 is formed in parallel with the bit lines 32, the grounding line 23 and the bit line 32 can be obtained from only one aluminum wiring layer. According to the fourth embodiment, it is not necessary to form a grounding line 32 in the cell array, but it is only required to form an aluminum alloy wiring within the cell array for bit lines 32. Consequently, bit lines 32 can be formed in straight in the column direction. Since the bit line 32 is formed straight, the bit line can be easily reformed such that some portions thereof, which corresponds to the areas of cells C, have a width larger than the other portions and sufficient to cover above at least the floating gate 16. Each widened aluminum alloy wire portion 32a of each bit line 32 shuts off the route carrying contaminants into the cell from above. Thus, an advantage similar to those of the first to third embodiments can be achieved with the fourth embodiment.

Figure 10:
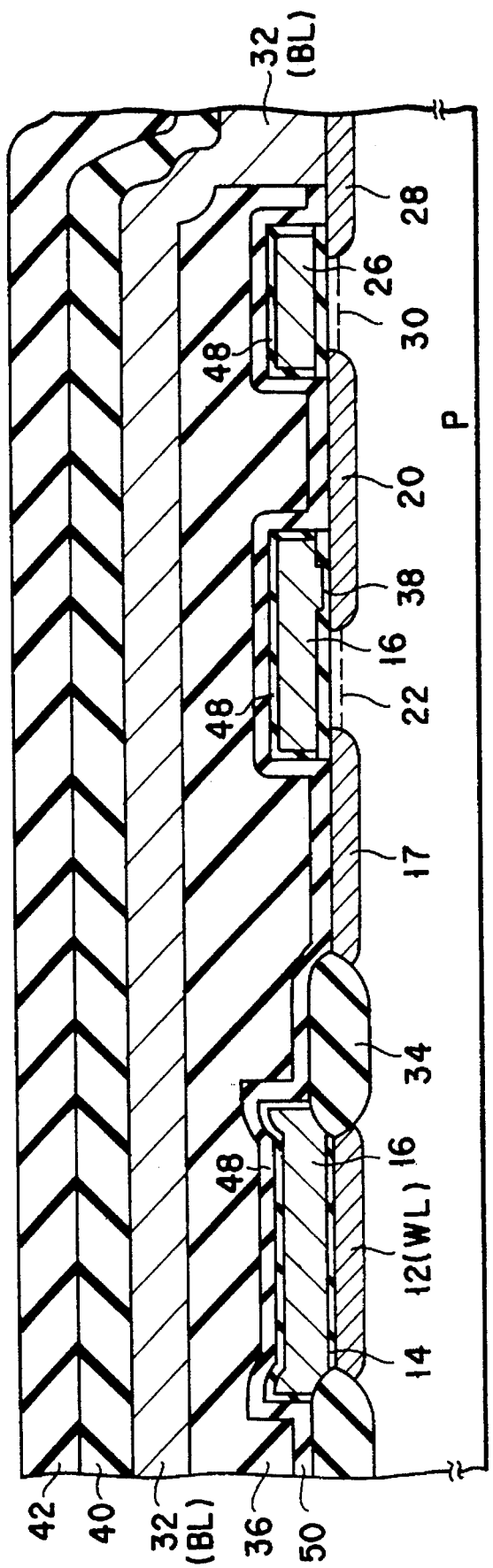
FIG. 10 is a diagram showing a cross section of a pattern of a non-volatile semiconductor memory device according to the fifth embodiment of the present invention.

FIG. 10 is a cross section of a cell having a "single polysilicon layer structure" according to the fifth embodiment of the present invention. As shown in FIG. 10, the fifth embodiment is a combination of cells having the structures shown in FIGS. 4 and 9, along with an additional structure in which a region above at least a floating gate 16 is covered by a nitride film 50, and some portions of a bit line 32 are widened to cover above a cell C, or at least the floating gate 16. With an EEPROM having the above-mentioned structure, an advantage similar to those of the first to fourth embodiments can be achieved. In the fifth embodiment, a selection gate 26 is provided so as to read out data in a cell transistor onto a bit line via a selection transistor, but formation of the selection gate 26 is not essential to the present invention.

Figure 11:
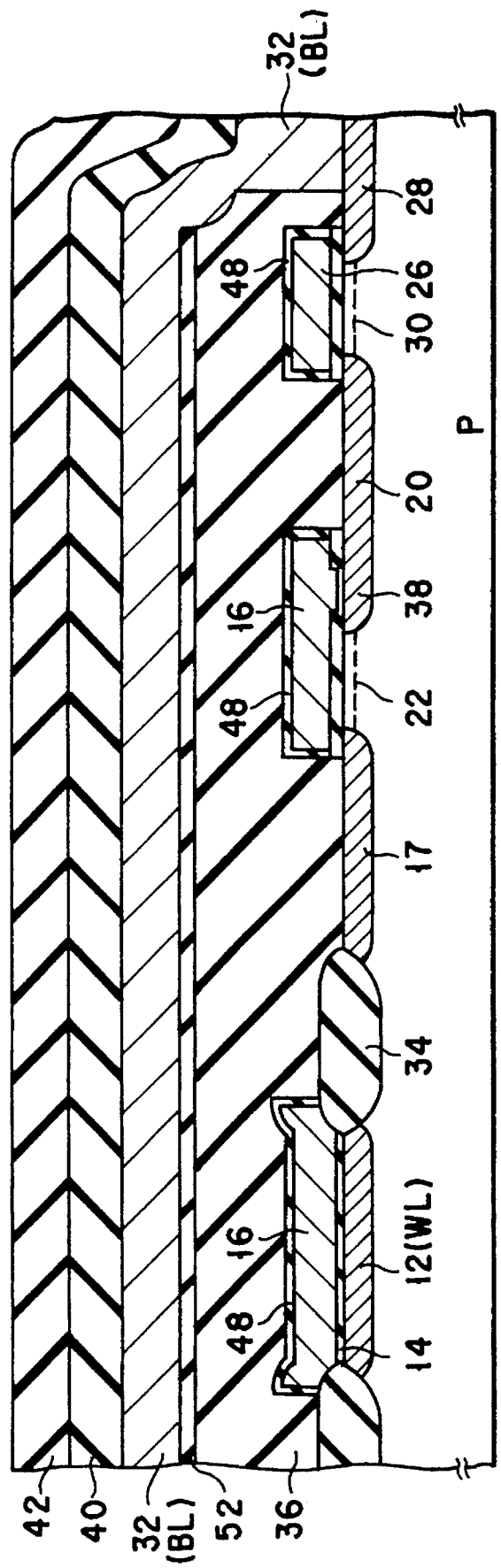
FIG. 11 is a diagram showing a cross section of a pattern of a non-volatile semiconductor memory device according to the sixth embodiment of the present invention.

FIG. 11 is a cross section of a cell having a "single polysilicon layer structure" according to the sixth embodiment of the present invention. As shown in FIG. 11, the sixth embodiment is a combination of cells having the structures shown in FIGS. 6 and 9, along with an additional structure in which a region above at least a floating gate 16 is covered by a polysilicon film 52, and a widened portion 32a of a bit line 32 made from an aluminum alloy wiring.

Figure 12:
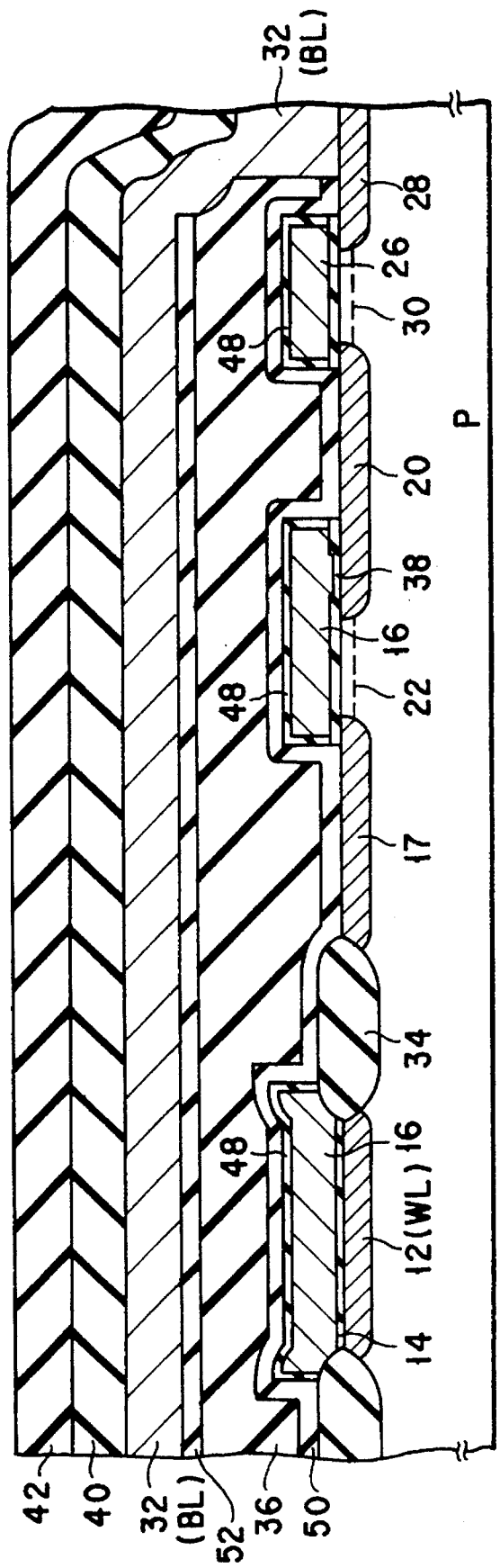
FIG. 12 is a diagram showing a cross section of a pattern of a non-volatile semiconductor memory device according to the seventh embodiment of the present invention.

FIG. 12 is a cross section of a cell having a "single polysilicon layer structure" according to the seventh embodiment of the present invention. As shown in FIG. 12, the seventh embodiment is a combination of cells having the structures shown in FIGS. 7 and 9, along with an additional structure in which a region above at least a floating gate 16 is covered by a nitride film 50, and a region above a cell C, or at least a floating gate 16, is covered by a polysilicon film 52 and a widened portion of a bit line 32.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A non-volatile semiconductor memory device comprising:
   a semiconductor substrate of a first conductivity type;
   a word line comprising a first semiconductor layer of a second conductivity type formed in said semiconductor substrate;
   a memory cell arranged on said semiconductor substrate, said memory cell having a single polysilicon layer structure and including:
      source and drain regions of the second conductivity type formed in said semiconductor substrate, and
      a floating gate, insulatively spaced from said semiconductor substrate, for controlling conduction of a channel region formed between said source and drain regions in accordance with a potential of said word line;
   a bit line extending linearly on said semiconductor substrate, said bit line including a first bit line portion and a second bit line portion which has a width greater than a width of said first bit line portion, said second bit line portion completely covering the region above the floating gate of said memory cell, thereby preventing at least one of movable ions and moisture from contaminating said floating gate; and
   a passivation layer for protecting said memory cell.

2. A non-volatile semiconductor memory device according to claim 1, further comprising at least one protecting layer formed so as to cover at least a region above said floating gate, for further preventing at least one of movable ions and moisture from contaminating said floating gate.

3. A non-volatile semiconductor memory device according to claim 2, wherein said at least one protecting layer comprises a nitride film which is insulatively spaced from said floating gate and is formed so as to cover a region above and a side surface of said floating gate.

4. A non-volatile semiconductor memory device according to claim 1, wherein said bit line is an aluminum alloy film.

5. A non-volatile semiconductor memory device according to claim 1, further comprising an interlayer insulating film formed under said passivation layer and electrically insulating said floating gate and said bit line from each other.

6. A non-volatile semiconductor memory device according to claim 5, further comprising at least one protecting layer formed so as to cover at least a region above said floating gate, for further preventing at least one of movable ions and moisture from contaminating said floating gate.

7. A non-volatile semiconductor memory device according to claim 6, wherein said at least one protecting layer comprises a high-resistance silicon film formed between said interlayer insulating film and said bit line.

8. A non-volatile semiconductor memory device according to claim 7, wherein said at least one protecting layer is formed as a barrier layer.

9. A non-volatile semiconductor memory device according to claim 6, wherein said at least one protecting layer includes a nitride film which is insulatively spaced from said floating gate and is formed so as to cover the region above and the side surface of said floating gate and a high-resistance silicon film formed between said interlayer insulating film and said bit line.

10. A non-volatile semiconductor memory device according to claim 9, wherein said high-resistance silicon film is formed as a polysilicon layer used for increasing bonding strength between a barrier layer and said interlayer insulating film.

11. A non-volatile semiconductor memory device comprising:
    a body of a semiconductor material of a first conductivity type having a major surface;
    a word line comprising a first impurity doped region formed in said major surface of said semiconductor body;
    a memory cell formed on said semiconductor body and having a single polysilicon layer structure, said memory cell comprising:
       second and third impurity doped regions of a second conductivity type formed in said major surface of said semiconductor body and spaced apart by a first channel region; and
       a floating gate insulatively spaced from said first channel region and said word line for controlling a conduction of said first channel region in accordance with a potential of said word line;
    a passivation layer, comprising a PSG film and a first silicon nitride film, for protecting said memory cell; and
    at least one protecting layer formed between said passivation layer and said floating gate to cover an entire surface of said memory cell including upper and side surfaces of said floating gate when viewed from a plane parallel to and above said major surface of said semiconductor body, thereby preventing at least one of moveable ions and moisture from contaminating said floating gate, said at least one protecting layer including a second silicon nitride film which is insulatively spaced from side walls and a top wall of said floating gate.

12. The non-volatile semiconductor memory device according to claim 11, further comprising a bit line and an interlayer insulating film for electrically insulating said floating gate and said bit line, and wherein said at least one protecting layer comprises first and second protecting layers, said first protecting layer being said second silicon nitride film and said second protecting layer being a polysilicon layer formed between said passivation layer and said interlayer insulating film.

13. The non-volatile semiconductor memory device according to claim 11, further comprising a bit line, and wherein said at least one protecting layer comprises first and second protecting layers, said bit line including a first bit line portion and a second bit line portion having a width greater than a width of said first bit line portion, said second bit line portion constituting said second protecting layer, and said second silicon nitride.

14. The non-volatile semiconductor memory device according to claim 11, further comprising a bit line and a selection gate, insulatively spaced from a second channel region and said bit line, for controlling a conduction of said second channel region in accordance with a potential of said bit line, wherein said at least one protecting layer is formed between said passivation layer and said selection gate to completely cover said selection gate when viewed from said plane parallel to and above said major surface of said semiconductor body, thereby preventing at least one of moveable ions and moisture from contaminating said selection gate.

15. The non-volatile semiconductor memory device according to claim 14, further comprising a bit line and an interlayer insulating film for electrically insulating said floating gate and said bit line, and wherein said at least one protecting layer comprises first and second protecting layers, said first protecting layer being said second silicon nitride film and said second protecting layer being a polysilicon layer formed between said passivation layer and said interlayer insulating film.

16. The non-volatile semiconductor memory device according to claim 14, further comprising a bit line and wherein said at least one protecting layer comprises first and second protecting layers, said bit line including a first bit line portion and a second bit line portion having a width greater than a width of said first bit line portion, said second bit line portion constituting said second protecting layer, and said first protecting layer being said second silicon nitride film.

17. A non-volatile semiconductor memory device according to claim 1, further comprising:

a plurality of word lines each comprising a first semiconductor layer of the second conductivity type formed in said semiconductor substrate, a plurality of memory cells arranged in rows and columns, each memory cell having a single polysilicon layer structure and including source and drain regions of the second conductivity type formed in said semiconductor substrate and a floating gate, insulatively spaced from said semiconductor substrate, for controlling conduction of a channel region formed between said source and drain regions in accordance with a potential of one of said word lines, and a plurality of bit lines each extending linearly in a column direction on said semiconductor substrate, each said bit line being associated with a respective corresponding column of memory cells and including first bit line portions and second bit line portions which have widths greater than widths of said first bit line portions, said second bit line portions completely covering the regions above the floating gates of the memory cells in the respective corresponding column of memory cells, thereby preventing at least one of movable ions and moisture from contaminating the floating gates.

18. A non-volatile semiconductor memory device according to claim 17, wherein each of said first semiconductor layers comprises a word line common to the memory cells in a corresponding row of memory cells.

19. A non-volatile semiconductor memory device according to claim 17, wherein the source regions of the memory cells comprise source diffusion regions which are common to corresponding rows of memory cells.

20. A non-volatile semiconductor memory device according to claim 17, wherein the sources of said memory cells are connected together.

21. A non-volatile semiconductor memory device according to claim 11, further comprising a bit line and an interlayer insulating film for electrically insulating said floating gate and said bit line, and wherein said at least one protecting layer comprises first, second, and third protecting layers, said bit line including a first bit line portion and a second bit line portion having a width greater than a width of said first bit line portion, said second bit line portion constituting said third protecting layer, a polysilicon layer arranged between said second bit line portion and said interlayer insulating film constituting said second protection layer, and said second silicon nitride film constituting said first protecting layer.

22. A non-volatile semiconductor memory device according to claim 14, further comprising a bit line and an interlayer insulating film for electrically insulating said floating gate and said bit line, and wherein said at least one protecting layer comprises first, second, and third protecting layers, said bit line including a first bit line portion and a second bit line portion having a width greater than a width of said first bit line portion, said second bit line portion constituting said third protecting layer, a polysilicon layer arranged between said second bit line portion and said interlayer insulating film constituting said second protection layer, and said second silicon nitride film constituting said first protecting layer.

* * * * *

UNITED STATES PATENT AND TRADEMARK OFFICE
CERTIFICATE OF CORRECTION

PATENT NO. : 5,545,906
DATED      : August 13, 1996
INVENTOR(S) : Hidemitsu OGURA et al.

It is certified that error appears in the above-indentified patent and that said Letters Patent is hereby corrected as shown below:

In claim 13, line 8, after "nitride", insert -- film constituting said first protecting layer --.

Signed and Sealed this

Eighth Day of July, 1997

Attest:

Attesting Officer

BRUCE LEHMAN

Commissioner of Patents and Trademarks